United States Patent
Nakahara et al.

(10) Patent No.: US 9,412,679 B1
(45) Date of Patent: Aug. 9, 2016

(54) POWER SEMICONDUCTOR DEVICE

(71) Applicant: Mitsubishi Electric Corporation, Tokyo (JP)

(72) Inventors: Kenta Nakahara, Tokyo (JP); Hiroshi Yoshida, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/925,444

(22) Filed: Oct. 28, 2015

(30) Foreign Application Priority Data

Mar. 16, 2015 (JP) ................................. 2015-051584

(51) Int. Cl.
*H01L 23/34* (2006.01)
*H01L 23/528* (2006.01)
*H01L 23/24* (2006.01)

(52) U.S. Cl.
CPC ................ *H01L 23/34* (2013.01); *H01L 23/24* (2013.01); *H01L 23/528* (2013.01)

(58) Field of Classification Search
CPC ....... H01L 23/24; H01L 23/34; H01L 23/528; H01L 23/142; H01L 23/373; H01L 24/48; H01L 24/499; H01L 2225/06589
USPC .......................... 257/693, 706, 712, 723, 784
See application file for complete search history.

(56) References Cited

U.S. PATENT DOCUMENTS

| | | | | |
|---|---|---|---|---|
| 5,430,330 A * | 7/1995 | Takahama et al. | ...... | H01L 21/56 257/788 |
| 6,335,548 B1 * | 1/2002 | Roberts et al. | .... | H01L 23/49562 250/239 |
| 6,979,843 B2 * | 12/2005 | Nakajima et al. | ..... | H01L 23/427 257/179 |
| 2003/0213979 A1 * | 11/2003 | Nakajima et al. | ..... | H01L 23/427 257/200 |
| 2012/0080800 A1 * | 4/2012 | Shinohara | ............... | H01L 23/24 257/773 |
| 2012/0256194 A1 * | 10/2012 | Yoshihara et al. | ...... | H01L 24/32 257/77 |
| 2012/0325454 A1 * | 12/2012 | Iwai et al. | ............. | H01L 23/373 165/185 |
| 2015/0115423 A1 * | 4/2015 | Yamashita | ........ | H01L 23/49575 257/675 |
| 2015/0255367 A1 | 9/2015 | Nakahara et al. | | |

FOREIGN PATENT DOCUMENTS

| | | |
|---|---|---|
| JP | 2010-219420 A | 9/2010 |
| JP | 2012-191010 A | 10/2012 |
| JP | 2015-170786 A | 9/2015 |

* cited by examiner

*Primary Examiner* — Nitin Parekh
(74) *Attorney, Agent, or Firm* — Studebaker & Brackett PC (57) ABSTRACT

An insulating substrate includes a base portion that is made of metal and serves as a radiating surface, an insulating layer, and a circuit pattern. The insulating substrate has convex warpage in the radiating surface at ambient temperature. A power semiconductor element is mounted on the circuit pattern. A sealing material has a thickness greater than a thickness of the insulating substrate. The sealing material has a linear expansion coefficient greater than a linear expansion coefficient of the insulating substrate in an in-plane direction of a mounting surface of the insulating substrate. A heat conduction layer is located on the radiating surface of the base portion and is solid at ambient temperature and is liquid at a temperature higher than or equal to a phase-change temperature higher than ambient temperature.

10 Claims, 7 Drawing Sheets

POWER SEMICONDUCTOR DEVICE

BACKGROUND OF THE INVENTION

1. Field of the Invention

The present invention elates to a power semiconductor device, and more particularly, to a power semiconductor device including a radiating surface cooled by a cooling unit.

2. Description of the Background Art

Japanese Patent Application Laid-Open No, 2012-191010 discloses a semiconductor device on which power semiconductor elements are mounted. The semiconductor device is attached to a cooling fin to which thermal conductivity paste is applied to dissipate heat generated by the semiconductor elements and is fixed with bolts to be used.

In the semiconductor device, a temperature of a radiating surface to which the cooling fin is attached with the thermal conductivity paste therebetween may greatly vary with an operating state of the power semiconductor elements. This changes a warped shape of the radiating surface, and a phenomenon in which the thermal conductivity paste is extruded from the portion between a cooling surface and the cooling fin may occur. This phenomenon is also referred to as a grease pump-out. A repetition of the pump-out under a heat cycle increases a heat resistance between the radiating surface and the cooling fin, and thus heat dissipation characteristics of the power semiconductor device greatly deteriorate.

SUMMARY OF THE INVENTION

The present invention has been made in view of the above-mentioned problems, and an object thereof is to provide a power semiconductor device capable of preventing extrusion of a heat conduction layer from a portion between an insulating substrate and a cooling unit under a heat cycle.

A power semiconductor device of the present invention includes a housing, at least one insulating substrate, at least one power semiconductor element, at least one wiring portion, a plurality of electrodes, a sealing material, and a heat conduction layer. The insulating substrate is attached to the housing. The insulating substrate has a radiating surface and a mounting surface opposite to the radiating surface. The insulating substrate has convex warpage in the radiating surface at ambient temperature. The mounting surface is housed in the housing. The insulating substrate includes a base portion, an insulating layer, and a circuit pattern. The base portion is made of metal. The base portion serves as the radiating surface. The insulating layer is located on the base portion. The circuit pattern is located on the insulating layer. The circuit pattern serves as the mounting surface. The power semiconductor element is mounted on the circuit pattern of the insulating substrate. The wiring portion connects the power semiconductor element and a portion of the circuit pattern of the insulating substrate remote from the power semiconductor element. The electrodes are attached to the housing and are electrically connected with at least any one of the circuit pattern of the insulating substrate and the power semiconductor element. The sealing material seals the power semiconductor element on the insulating substrate in the housing. The sealing material has a thickness greater than a thickness of the insulating substrate. The sealing material has a linear expansion coefficient greater than a linear expansion coefficient of the insulating substrate in an in-plane direction of the mounting surface of the insulating substrate. The heat conduction layer is located on the radiating surface and is solid at ambient temperature and is liquid at a temperature higher than or equal to a phase-change temperature higher than ambient temperature.

In the present invention, when the heat conduction layer comes to be liquid by the temperature rise due to the heat from the power semiconductor element, the sufficiently thick sealing material has the linear expansion coefficient greater than that of the insulating substrate, which relieves the convex shape of the radiating surface of the insulating substrate. This gathers the heat conduction layer being liquid in the center of the insulating substrate, thereby keeping the heat conduction layer between the insulating substrate and the cooling unit. Moreover, when the shape of the radiating surface of the insulating substrate returns to the original convex shape by the decrease in temperature, the heat conduction layer loses liquidity, which prevents extrusion of the heat conduction layer from the portion between the insulating substrate and the cooling unit. As a result, the heat conduction layer is prevented from being extruded from the portion between the insulating substrate and the cooling fin under a heat cycle.

These and other objects, features, aspects and advantages of the present invention will become more apparent from the following detailed description of the present invention when taken in conjunction with the accompanying drawings.

DESCRIPTION OF THE PREFERRED EMBODIMENTS

Preferred embodiments according to the present invention will be described below with reference to the drawings. In the following drawings, the same or corresponding components are denoted by the same references, and their descriptions will not be repeated here.

First Preferred Embodiment

Figure 1:
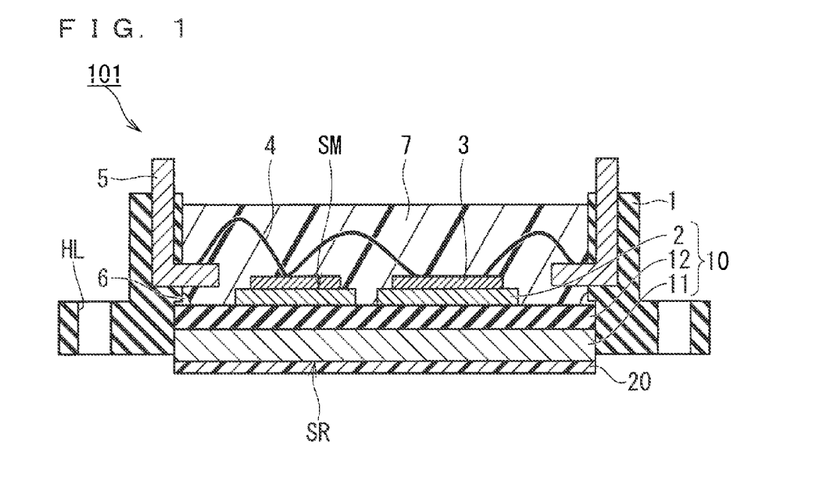
FIG. 1 is a cross-sectional view schematically showing a configuration of a power semiconductor device in a first preferred embodiment of the present invention.

With reference to FIG. 1, a power module 101 (power semiconductor device) includes a housing 1, an insulating substrate 10, power semiconductor elements 3, a metal wire 4 (wiring portion), electrodes 5, a sealing material 7, and a heat conduction layer 20.

The housing 1 is made of insulation. The housing 1 has through holes HL disposed along an outer periphery of the power module 101.

The insulating substrate 10 is attached to the housing 1. The attachment may be performed by bonding with an adhesive 6, for example. The insulating substrate 10 has a radiating surface SR and a mounting surface SM opposite to the radiating surface SR. The mounting surface SM is housed in the housing 1.

Specifically, the insulating substrate 10 includes a base plate 11 (base portion), an insulating sheet 12 (insulating layer), and a circuit pattern 2. The base plate 11, the insulating sheet 12, and the circuit pattern 2 are integrated.

The base plate 11 serves as the radiating surface SR. The base plate 11 is made of metal. The metal of the base plate 11 preferably has high heat conductivity. In an example of this preferred embodiment, the base plate 11 is a plate that is made of copper having a linear expansion coefficient of 17 ppm and has a thickness of 2 mm.

The insulating sheet 12 is located on the base plate 11. A material for the insulating sheet 12 preferably has high insulation. In an example of this preferred embodiment, the insulating sheet 12 is a sheet that is made of epoxy resin and has a thickness of 0.1 mm.

The circuit pattern 2 is located on the insulating sheet 12. The circuit pattern 2 serves as the mounting surface SM. The circuit pattern 2 is preferably made of metal having high heat conductivity. In an example of this preferred embodiment, the circuit pattern 2 is a pattern that is made of copper having a linear expansion coefficient of 17 ppm and has a thickness of 0.5 mm.

The epoxy resin sheet that has the thickness of 0.1 mm and serves as the insulating sheet 12 is sufficiently less conducive to a linear expansion coefficient of the insulating substrate 10 than the copper plate that has the thickness of 2 mm and serves as the base plate 11 and the copper layer that has the thickness of 0.5 mm and serves as the circuit pattern 2. Thus, in this preferred embodiment, the linear expansion coefficient of the insulating substrate 10 in an plane direction of the mounting surface SM of the insulating substrate 10 is almost equal to 17 ppm being the linear expansion coefficient of the base plate 11 and the circuit pattern 2.

The insulating substrate 10 has convex warpage in the radiating surface SR at ambient temperature (approximately, 25° C.). The insulating substrate 10 has concave warpage in the radiating surface SR at an upper limit of an operation temperature of the power semiconductor elements 3. The temperature at which the shape of the radiating surface SR varies from the convex shape to the concave shape is preferably lower than an operation temperature under steady operating conditions, and the temperature is assumed to be 125° C. in this preferred embodiment.

The power semiconductor elements 3 are mounted on the circuit pattern 2 of the insulating substrate 10. The power semiconductor elements 3 are transistor elements such as insulated gate bipolar transistors (IGBTs) and metal oxide semiconductor field effect transistors (MOSFETs).

The metal wire 4 connects the power semiconductor elements 3 and a portion of the circuit pattern 2 of the insulating substrate 10 remote from the power semiconductor elements 3.

The electrodes 5 are electrically connected with the outside of the power module 101. The electrodes 5 are attached to the housing 1 and are exposed on the housing 1. The electrodes 5 are electrically connected with at least any one of the circuit pattern 2 of the insulating substrate 10 and the power semiconductor elements 3 by the metal wire 4.

The sealing material 7 seals the power semiconductor elements 3 on the insulating substrate 10 in the housing 1. The sealing material 7 is made of insulation, such as resin and gel. The sealing material 7 has a thickness that is greater than a thickness of the insulating substrate 10 and that is 10 mm in an example of this preferred embodiment. The sealing material 7 has a linear expansion coefficient that is greater than the linear expansion coefficient of the insulating substrate 10 in the in-plane direction of the mounting surface SM and that is 19 ppm in an example of this preferred embodiment. The linear expansion coefficient of the sealing material 7 is less than or equal to 1.5 times the linear expansion coefficient of the insulating substrate 10 in the in-plane direction of the mounting surface SM.

The heat conduction layer 20 is located on the radiating surface SR. The heat conduction layer 20 is made of a phase-change heat conduction material. The heat conduction layer 20 is solid at ambient temperature and is liquid at a temperature higher than or equal to a phase-change temperature higher than ambient temperature. Here, "solid" may refer to a rubbery state while "liquid" may refer to a grease-like state. The phase-change temperature is lower than an upper limit of an operation temperature of the power module 101 and is preferably lower than an operation temperature under steady operating conditions. Moreover, the phase-change temperature is preferably sufficiently higher than ambient temperature and is preferably higher than or equal to 40° C., for example. This preferred embodiment is assumed to use a phase-change heat conduction material having a phase-change temperature of 45° C. For example, "LOCTITE TCP 4000 PM," which is Henkel AG & Co. KGaA's product name, may be used as the phase-change heat conduction material.

The heat conduction layer 20 is formed in the following manner, for example. First, a paste containing the phase-change heat conduction material and a solvent is prepared. Next, the paste is applied to the base plate 11. The solvent in the paste is vaporized, to thereby form the heat conduction Layer 20.

Figure 2:
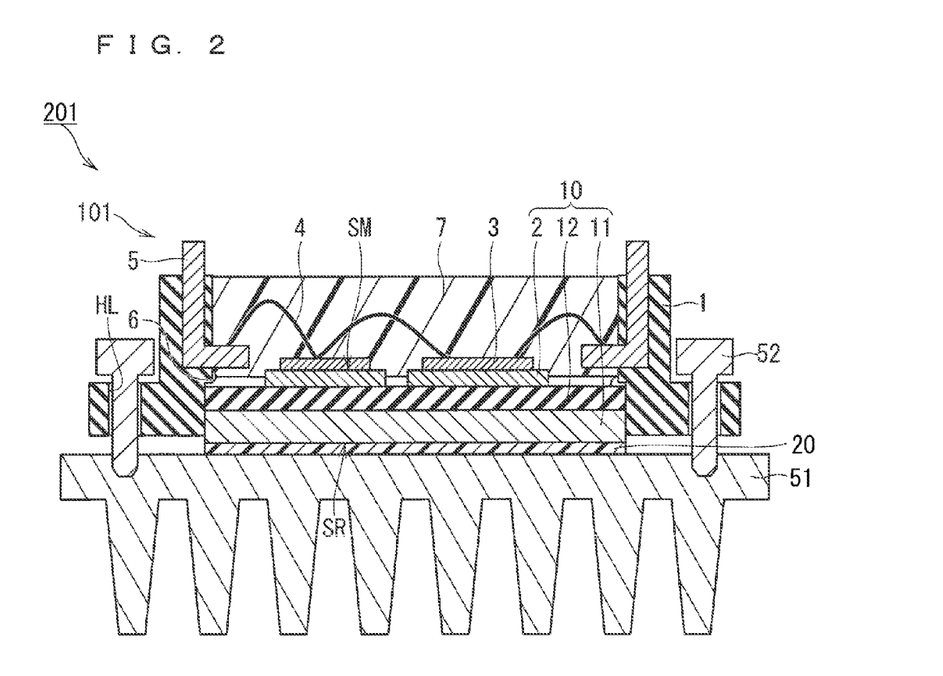
FIG. 2 is a cross-sectional view schematically showing a configuration of the power semiconductor device in FIG. 1 including a cooling unit.

With reference to FIG. 2, a cooling-unit-equipped power module 201 (power semiconductor device) includes the power module 101, a cooling fin 51 (cooling unit), and bolts 52 (fittings). The cooling fin 51 is in contact with the radiating surface SR with the heat conduction layer 20 therebetween. The bolts 52 are screwed in the cooling fin 51 through the through holes HL of the housing 1. The cooling fin 51 is pressed against the insulating substrate 10 with the heat conduction layer 20 therebetween by axial force of the bolts 52.

In this preferred embodiment, a temperature of the insulating substrate 10 increases to approximately 45° C. by a start of an operation of the cooling-unit-equipped power module 201, and the heat conduction layer 20 starts to be grease-like. When the temperature increases to approximately 125° C., the shape of the radiating surface SR varies from the convex shape to the concave shape. Subsequently, the temperature of the insulating substrate 10 may increase to an upper limit of an operation temperature of the cooling-unit-equipped power module 201. In the meantime, the radiating surface SR has the concave shape. The temperature of the insulating substrate 10 decreases to approximately 125° C. by a stop of the operation of the cooling-unit-equipped power module 201, and the shape of the radiating surface SR starts to vary from the concave shape to the convex shape. When the temperature decreases to 45° C., the heat conduction layer 20 starts to vary from the grease-like state to the rubbery state.

In this preferred embodiment, when the heat conduction layer 20 comes to be liquid by the temperature rise due to the heat from the power semiconductor elements 3, the sufficiently thick sealing material 7 has the linear expansion coefficient greater than that of the insulating substrate 10, which relieves the convex shape of the radiating surface SR of the insulating substrate 10. This gathers the heat conduction layer 20 being liquid in the center of the insulating substrate 10, thereby keeping the heat conduction layer 20 between the insulating substrate 10 and the cooling unit. Moreover, when the shape of the radiating surface SR of the insulating substrate 10 returns to the original convex shape by the decrease in temperature, the heat conduction layer 20 loses liquidity, which prevents extrusion of the heat conduction layer 20 from the portion between the insulating substrate 10 and the cooling unit. As a result, the heat conduction layer 20 is prevented from being extruded from the portion between the insulating substrate 10 and the cooling fin 51 under a heat cycle. In other words, a pump-out phenomenon is prevented.

The pump-out phenomenon is prevented, which prevents an increase in a contact heat resistance between the insulating substrate 10 and the cooling unit. Thus, a compact cooling fin 51 can be used. Consequently, the cooling-unit-equipped power module 201 can be reduced in size.

When the cooling fin 51 is attached to the radiating surface SR on which the heat conduction layer 20 is provided with the bolts 52 at ambient temperature, the convex shape of the radiating surface SR is pressed against the cooling fin 51, so that the axial force of the bolts 52 can be easily obtained. Thus, the cooling fin 51 can be more sufficiently pressed against the insulating substrate 10. This prevents the increase in the contact heat resistance caused by the cooling fin 51 being insufficiently pressed against the insulating substrate 10. Consequently, the insulating substrate 10 can be cooled more reliably.

The radiating surface SR of the insulating substrate 10 has the concave warpage at the upper limit of the operation temperature of the power semiconductor elements 3, so that the heat conduction layer 20 being liquid is more reliably gathered in the center of the insulating substrate 10. Thus, the heat conduction layer 20 is more reliably prevented from being extruded from the portion between the insulating substrate 10 and the cooling unit under the heat cycle.

The linear expansion coefficient of the sealing material 7 is less than or equal to 1.5 times the linear expansion coefficient of the insulating substrate 10 in the in-plane direction of the mounting surface SM, so that an excess temperature dependence of an amount of warpage in the insulating substrate 10 can be prevented. For example, a variation in the amount of warpage can be suppressed to less than or equal to approximately 50 μm per change in temperature of 100° C. This can more reliably prevent the phenomenon in which the heat conduction layer 20 is extruded from the portion between the insulating substrate 10 and the cooling unit, the phenomenon being caused by the change in warpage in the substrate under the heat cycle. In the conventional typical configuration, a variation in an amount of warpage is, for example, approximately 200 μm per change in temperature of 100° C.

In addition, this preferred embodiment uses the metal wire 4 (FIG. 1) as the wiring portion, but a metal frame described in a second preferred embodiment may be used instead.

Second Preferred Embodiment

Figure 3:
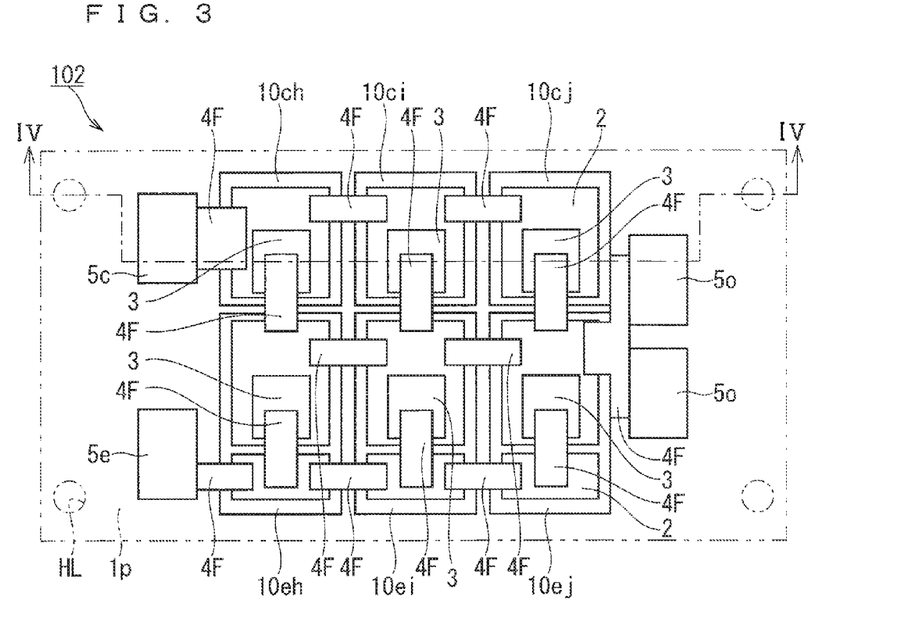
FIG. 3 is a plan view schematically showing a configuration of a power semiconductor device in a second preferred embodiment of the present invention.
Figure 4:
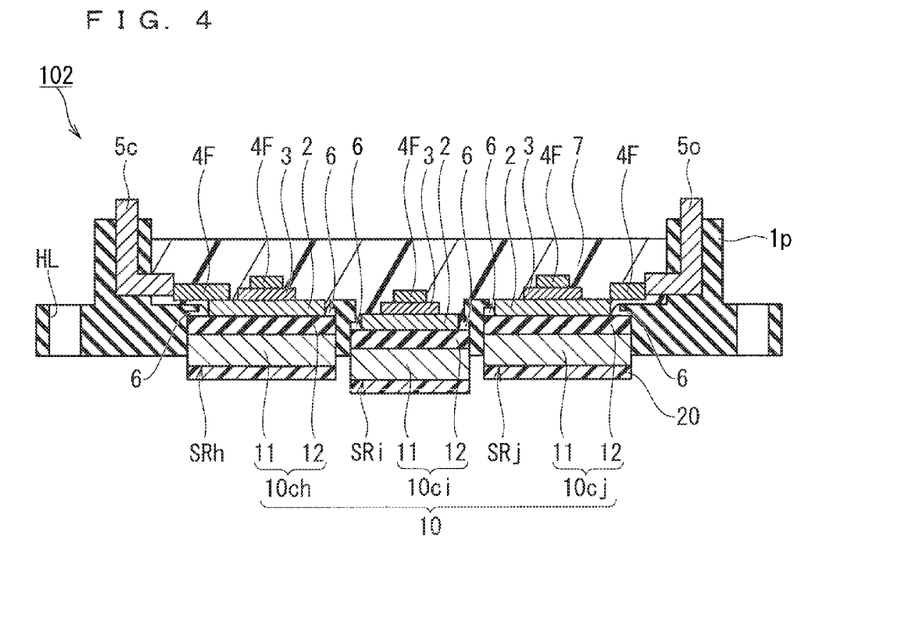
FIG. 4 is a schematic cross-sectional view taken along an IV-IV line in FIG. 3.
Figure 5:
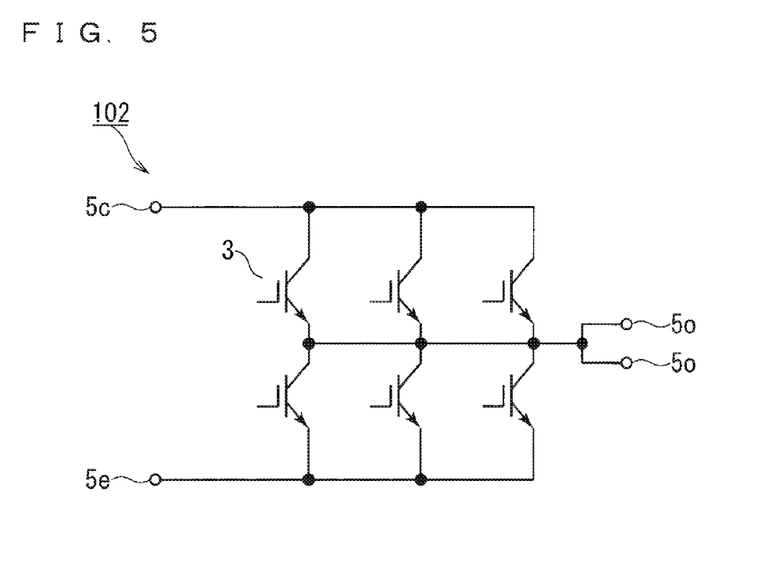
FIG. 5 is a diagram of a circuit in FIG. 3.

FIG. 3 is a plan view schematically showing a configuration of a power module 102 (power semiconductor device) in this preferred embodiment. FIG. 4 is a schematic cross-sectional view taken along an Iv-Iv line (FIG. 3). FIG. 5 is a diagram of a circuit of the power module 102. In FIG. 3, the sealing material 7 (FIG. 4) is not shown and a housing 1p (FIG. 4) is shown with the outer edge and the through holes HL (FIG. 4). With reference to FIG. 4, the insulating substrate 10 in the power module 102 includes an insulating substrate 10ch (first insulating substrate) having a radiating surface SRh (first radiating surface), an insulating substrate 10cj (second insulating substrate) having a radiating surface SRj (second radiating surface), and an insulating substrate 10ci (third insulating substrate) that is disposed between the insulating substrate 10ch and the insulating substrate 10cj and has a radiating surface SRi (third radiating surface). The radiating surface SRi protrudes more than the radiating surfaces SRh and SRj in a direction to face the cooling fin 51 (FIG. 2).

With reference to FIG. 3, the insulating substrate 10 further includes an insulating substrate 10eh, an insulating substrate 10ei, and an insulating substrate 10ej (FIG. 3). The insulating substrates 10eh to 10ej each have a configuration of a radiating surface similar to the configuration of the radiating surface of the insulating substrates 10ch to 10cj described above.

The power module 102 includes the plurality of power semiconductor elements 3. The insulating substrates 10ch to 10cj and 10eh to 10ej each include only one of the power semiconductor elements 3 mounted thereon. In other words, the power module 102 includes the plurality of insulating substrates 10 on which each of the plurality of power semiconductor elements 3 is mounted.

To form a current path of the circuit shown in FIG. 5 with the circuit pattern 2, the power module 102 includes a metal frame 4F (wiring portion) instead of the metal wire 4 (FIG. 1).

The power module 102 includes the housing 1p instead of the housing 1 (FIG. 1). The housing 1p as shown in FIG. 4 has partitioning portions located between the plurality of insulating substrates 10. Thus, the plurality of insulating substrates 10 can be attached to the housing 1p. The housing 1p has almost the same configuration as that of the housing 1 except for that point.

The power module 102 includes an electrode 5c (first input electrode), an electrode 5e (second input electrode), and electrodes 5o (output electrodes). The electrode 5c and the electrode 5e are respectively connected with a collector side and an emitter side in a series structure of the two power semiconductor elements 3 in the circuit shown in FIG. 5. The electrodes 5o are connected with a middle portion in the series structure. Thus, a positive potential (first potential) is applied to the electrode 5c while a negative potential (second potential different from the first potential) is applied to the electrode 5e. The electrodes 5o output a potential switched between the positive potential and the negative potential.

The configuration except for that described above is almost the same as the configuration of the first preferred embodiment as described above, so that the same or corresponding components are denoted by the same references, and their descriptions will not be repeated here.

This preferred embodiment uses the metal frame 4F (FIGS. 3 and 4) as the wiring portion, and thus a cross-sectional area of the wiring portion can be increased more than that of the metal wire 4 (FIG. 1). Consequently, an allowable current of the wiring portion can be increased.

The plurality of insulating substrates 10 are used instead of using only one insulating substrate, and thus an amount of warpage in the plurality of insulating substrates 10 seen as the whole can be suppressed. This more reliably prevents the phenomenon in which the heat conduction layer 20 is extruded from the portion between the insulating substrate 10 and the cooling unit, the phenomenon being caused by the change in warpage in the substrate under the heat cycle.

The plurality of insulating substrates 10 each include only one of the power semiconductor elements 3 mounted thereon. This can suppress heat interference between the power semiconductor elements 3.

The radiating surface SRi (FIG. 4) protrudes more than the radiating surfaces SRh and SRj. This allows the insulating substrate 10ci to be more reliably pressed against the cooling fin 51 (FIG. 2); otherwise a sufficient force would be hardly applied to the insulating substrate 10ci from the housing 1p because the insulating substrate 10ci is disposed between the insulating substrates 10ch and 10cj. This can more reliably cool the insulating substrate 10ci. In addition, the effects described in the previous paragraphs can be obtained when the radiating surface SRi does not protrude.

Figure 6:
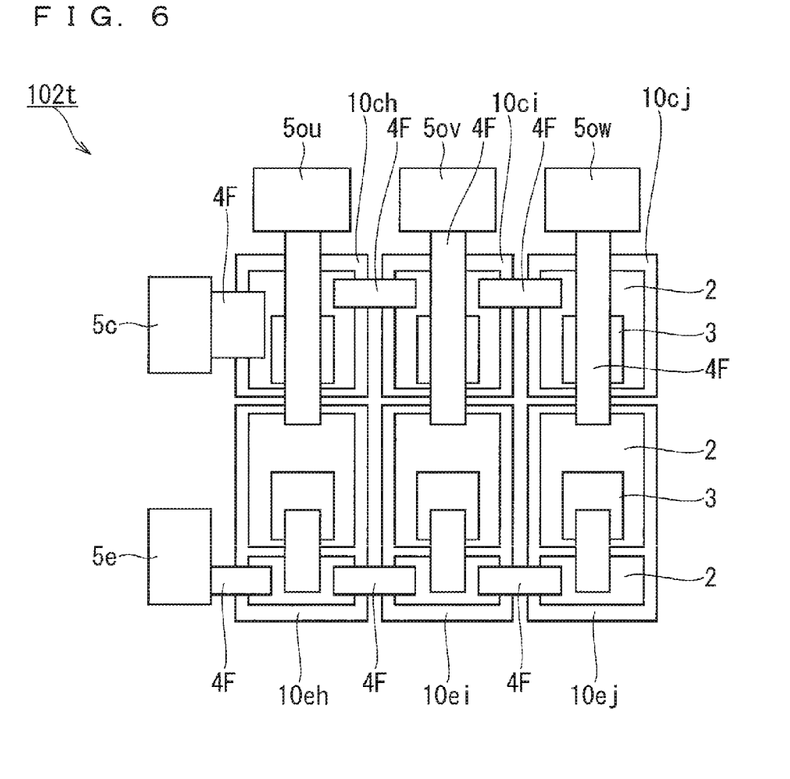
FIG. 6 is a plan view showing a modification of FIG. 3.
Figure 7:
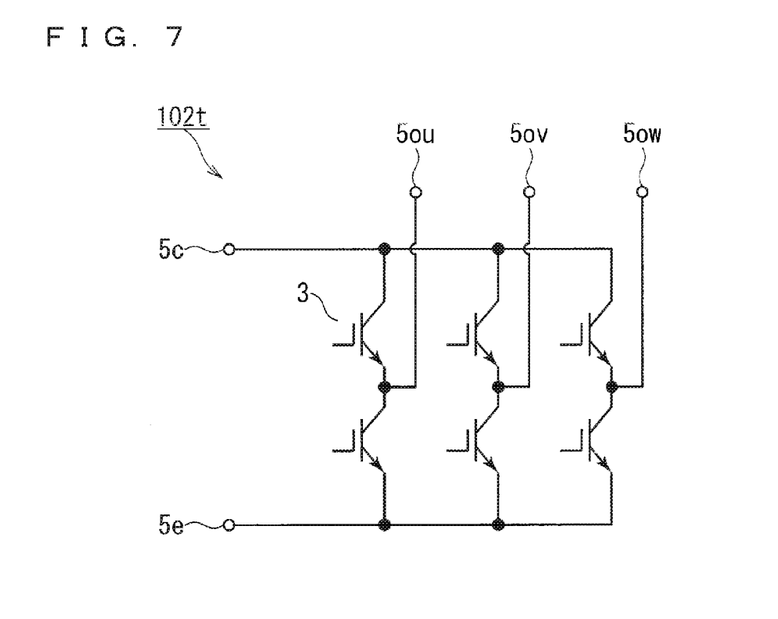
FIG. 7 is a diagram of a circuit in FIG. 6.

FIG. 6 is a plan view schematically showing a configuration of a power module 102t (power semiconductor device) of a modification. FIG. 7 is a diagram of a circuit of the power module 102t. The power module 102t includes an electrode 5ou, an electrode 5ov, and an electrode 5ow (output electrodes) for a three-phase output instead of the electrodes 5o. The sealing material 7 and the housing 1p (FIG. 4) are omitted from FIG. 6. In this modification, the multi-phase power module can obtain effects similar to those described above.

In the descriptions above, the power semiconductor elements 3 are described as the elements (such as IGBTs) including the collector and the emitter, but the power semiconductor elements 3 are not limited to those including the collector and the emitter. For example, power semiconductor elements 3 may include a drain and a source corresponding to a collector and an emitter, respectively.

Third Preferred Embodiment

Figure 8:
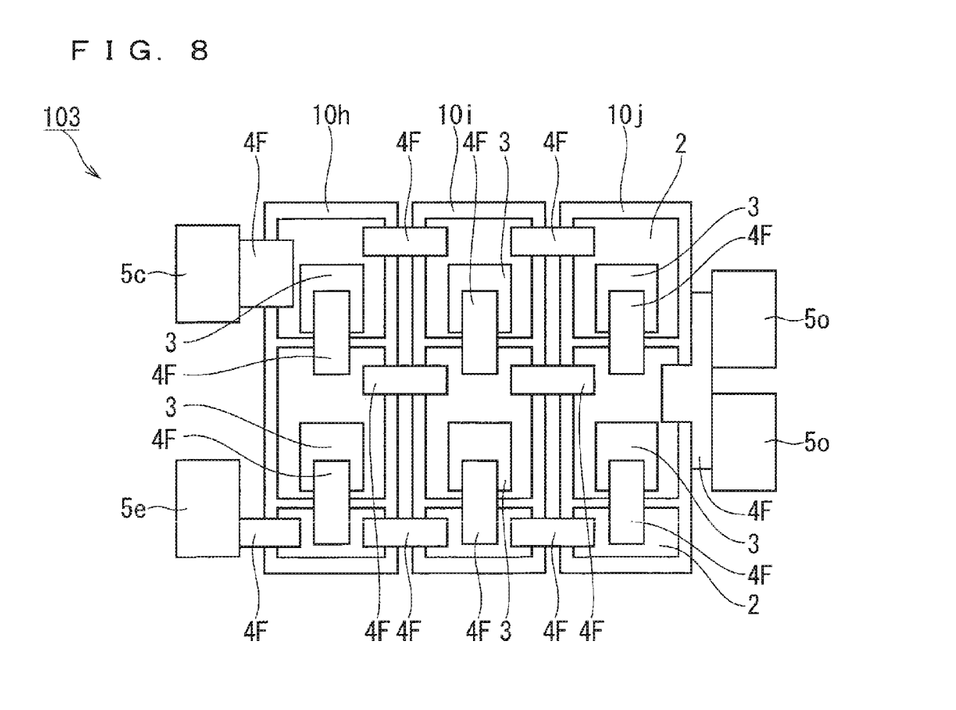
FIG. 8 is a plan view schematically showing a configuration of a power semiconductor device in a third preferred embodiment of the present invention.

FIG. 8 is a plan view schematically showing a configuration of a power module 103 (power semiconductor device) in this preferred embodiment. The sealing material 7 and the housing 1p (FIG. 4) are omitted from FIG. 8.

The power module 103 includes an insulating substrate 10h, an insulating substrate 10i, and an insulating substrate 10j. The insulating substrates 10h to 10j each include the two power semiconductor elements 3 mounted thereon, the two power semiconductor elements 3 being electrically connected with each other n series. Thus, a unit including the two power semiconductor elements 3 electrically connected with each other in series can be formed on each of the insulating substrates 10h to 10j, An adjustment to the number of units can adjust a capacity of the power module 103. Forming into the unit can standardize a configuration of an insulating substrate used in the power module 103. The configuration of the unit is standardized in this manner, which can increase productivity of the power module.

In addition, each of the insulating substrates may include more than two power semiconductor elements in series mounted thereon.

The configuration except for that described above is almost the same as the configuration of the power module 102 (second preferred embodiment), so that the same or corresponding components are denoted by the same references, and their descriptions will not be repeated here.

Figure 9:
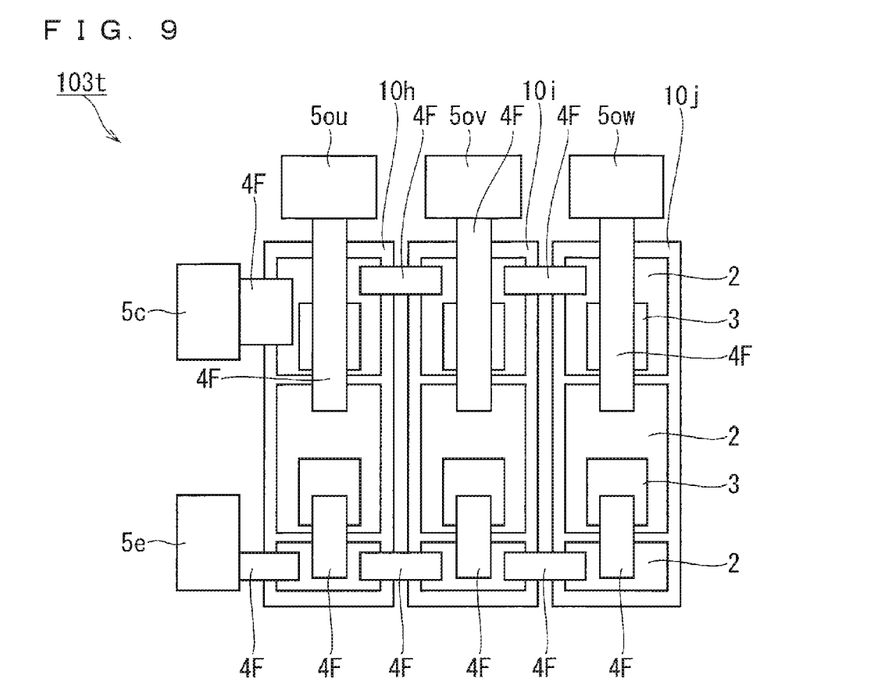
FIG. 9 is a plan view showing a modification of FIG. 8.

FIG. 9 is a plan view schematically showing a configuration of a power module 103t (power semiconductor device) of a modification. The power module 103t has a configuration of a circuit similar to the configuration (FIG. 7) of the circuit of the power module 102t. The sealing material 7 and the housing 1p (FIG. 4) are omitted from FIG. 9. In this modification, the multi-phase power module can obtain effects similar to those described above. Specifically, the adjustment to the number of units can adjust the number of phases.

Fourth Preferred Embodiment

Figure 10:
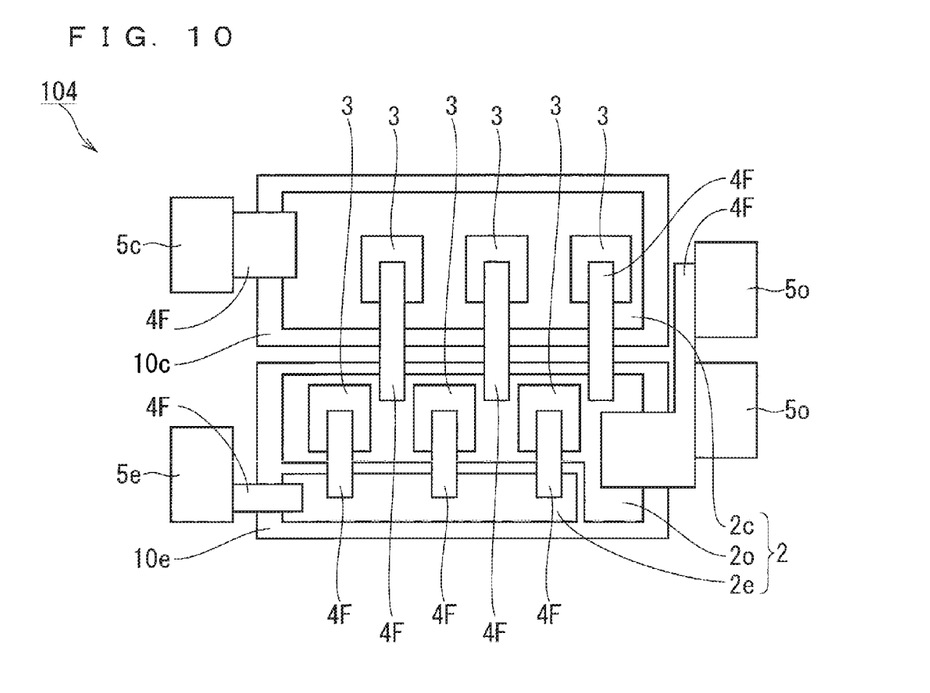
FIG. 10 is a plan view schematically showing a configuration of a power semiconductor device in a fourth preferred embodiment of the present invention.

FIG. 10 is a plan view schematically showing a configuration of a power module 104 (power semiconductor device) in this preferred embodiment. The sealing material 7 and the housing 1p (FIG. 4) are omitted from FIG. 10.

The power module 104 includes an insulating substrate 10c (first insulating substrate) and an insulating substrate 10e (second insulating substrate). A circuit pattern 2c of the insulating substrate 10c has a portion connected with the electrode 5c. A circuit pattern 2e of the insulating substrate 10e has a portion connected with the electrode 5e and a portion connected with the electrodes 5o.

The configuration except for that described above is almost the same as the configuration of the power module 102 (second preferred embodiment), so that the same or corresponding components are denoted by the same references, and their descriptions will not be repeated here.

Figure 11:
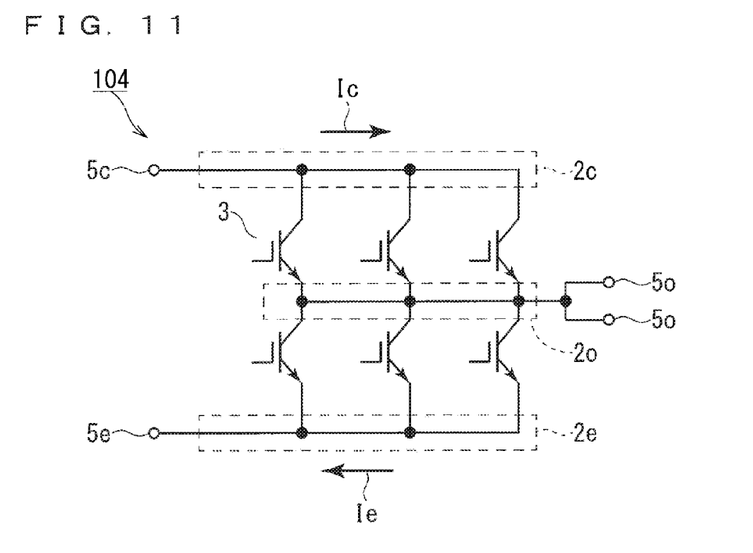
FIG. 11 is a diagram of a circuit in FIG. 10.

As shown in FIG. 11, this preferred embodiment can change a direction of a current Ic from the electrode 5c and a direction of a current Ie to the electrode 5e to approximately opposite directions by an alignment of the insulating substrates 10c and 10e. As a result, an effect of a mutual inductance can reduce an inductance between patterns that is a challenge of a large-capacity power module in particular.

Figure 12:
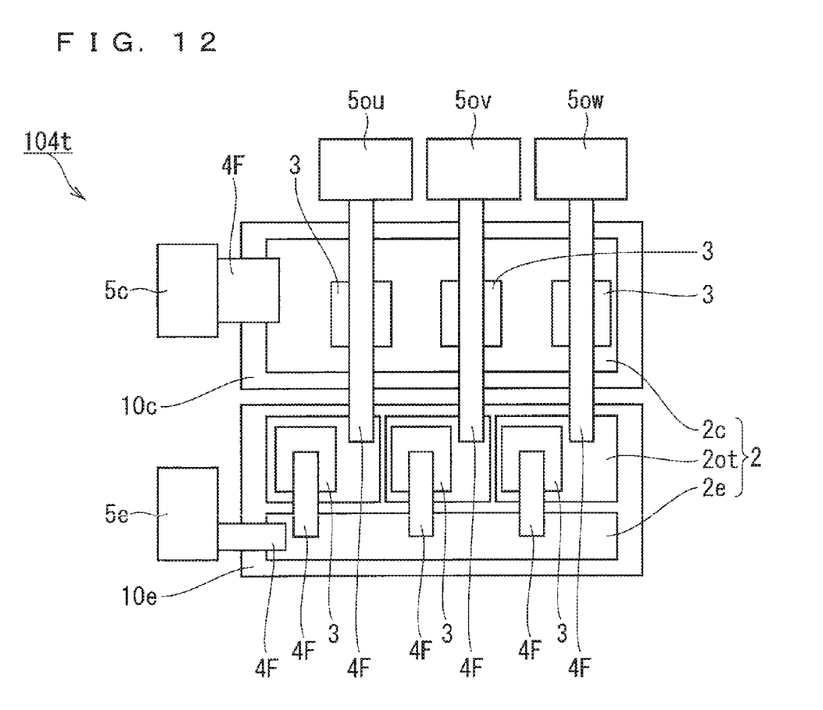
FIG. 12 is a plan view showing a modification of FIG. 10.
Figure 13:
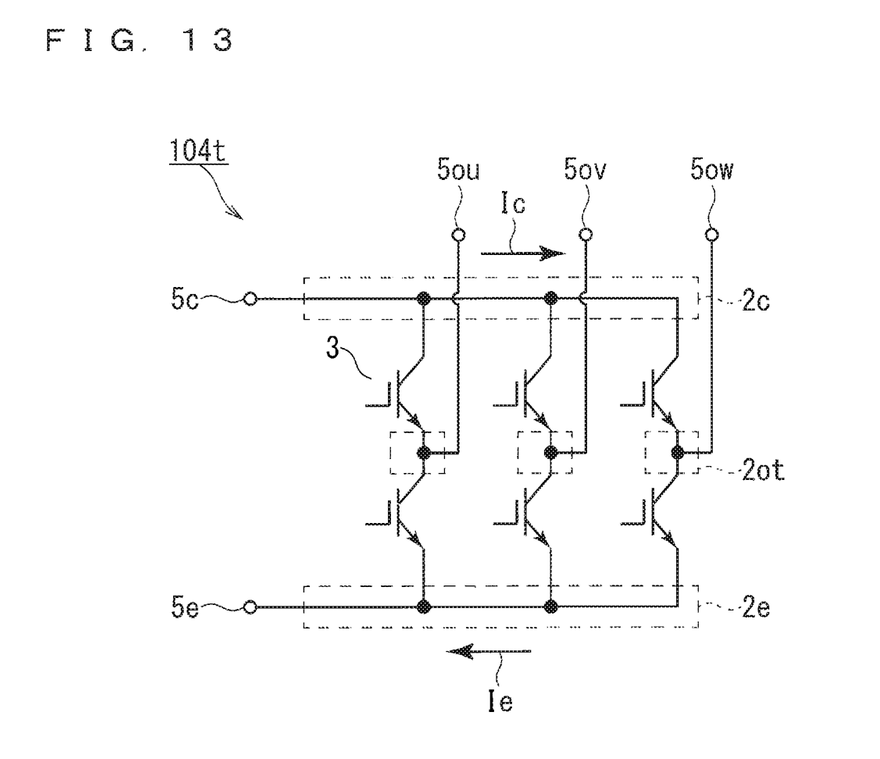
FIG. 13 is a diagram of a circuit in FIG. 12.

FIG. 12 is a plan view schematically showing a configuration of a power module 104t (power semiconductor device) of a modification. FIG. 13 is a diagram of a circuit of the power module 104t. The sealing material 7 and the housing 1p (FIG. 4) are omitted from FIG. 12. In this modification, the multi-phase power module can obtain effects similar to those described above.

In addition, according to the present invention, the above preferred embodiments can be arbitrarily combined, or each preferred embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A power semiconductor device, comprising:
   a housing;
   at least one insulating substrate that is attached to said housing, has a radiating surface and a mounting surface opposite to said radiating surface, and has convex warpage in said radiating surface at ambient temperature, said mounting surface being housed in said housing, said insulating substrate including
   a base portion that comprises metal and serves as said radiating surface,
   an insulating layer located on said base portion, and
   a circuit pattern that is located on said insulating layer and serves as said mounting surface;
   at least one power semiconductor element mounted on said circuit pattern of said insulating substrate;
   at least one wiring portion that connects said power semiconductor element and a portion of said circuit pattern of said insulating substrate remote from said power semiconductor element;
   a plurality of electrodes that are attached to said housing and are electrically connected with at least any one of said circuit pattern of said insulating substrate and said power semiconductor element;

a sealing material that seals said power semiconductor element on said insulating substrate in said housing, said sealing material having a thickness greater than a thickness of said insulating substrate in a perpendicular direction to said mounting surface of said insulating substrate, said sealing material having a linear expansion coefficient greater than a linear expansion coefficient of said insulating substrate in an in-plane direction of said mounting surface of said insulating substrate; and a heat conduction layer that is located on said radiating surface and is solid at ambient temperature and is liquid at a temperature higher than or equal to a phase-change temperature higher than ambient temperature.

2. The power semiconductor device according to claim 1, wherein said insulating substrate has concave warpage in said radiating surface at an upper limit of an operation temperature of said power semiconductor element.

3. The power semiconductor device according to claim 1, wherein the linear expansion coefficient of said sealing material is less than or equal to 1.5 times the linear expansion coefficient of said insulating substrate in the in-plane direction of said mounting surface of said insulating substrate.

4. The power semiconductor device according to claim 1, wherein said wiring portion comprises a metal frame.

5. The power semiconductor device according to claim 1, wherein said at least one power semiconductor element comprises a plurality of power semiconductor elements, and said at least one insulating substrate comprises a plurality of insulating substrates.

6. The power semiconductor device according to claim 5, wherein said plurality of insulating substrates comprise a first insulating substrate having a first radiating surface, a second insulating substrate having a second radiating surface, and a third insulating substrate that is disposed between said first insulating substrate and said second insulating substrate and has a third radiating surface, said third radiating surface protruding more in the perpendicular direction to the respective mounting surface of said insulating substrates than said first radiating surface and said second radiating surface.

7. The power semiconductor device according to claim 5, wherein said plurality of insulating substrates each include only one of said power semiconductor elements mounted thereon.

8. The power semiconductor device according to claim 5, said plurality of insulating substrates each include two or more said power semiconductor elements mounted thereon, two or more said power semiconductor elements being electrically connected with each other in series.

9. The power semiconductor device according to claim 1, wherein said electrodes include:
a first input electrode to which a first potential is applied;
a second input electrode to which a second potential different from said first potential is applied; and
an output electrode that outputs a potential switched between said first potential and said second potential, and said insulating substrate includes:
a first insulating substrate having a portion of said circuit pattern connected with said first input electrode; and
a second insulating substrate having a portion of said circuit pattern connected with said second input electrode.

10. The power semiconductor device according to claim 1, further comprising a cooling unit in contact with said heat conduction layer, said heat conduction layer being between said radiation surface and said cooling unit.

* * * * *